(12) United States Patent
Peng

(10) Patent No.: US 10,943,956 B2
(45) Date of Patent: Mar. 9, 2021

(54) DISPLAY PANEL AND MANUFACTURING METHOD THEREOF

(71) Applicant: SHENZHEN CHINA STAR OPTOELECTRONICS SEMICONDUCTOR DISPLAY TECHNOLOGY CO., LTD., Guangdong (CN)

(72) Inventor: Wenxiang Peng, Guangdong (CN)

(73) Assignee: SHENZHEN CHINA STAR OPTOELECTONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 16/612,966

(22) PCT Filed: Jun. 12, 2019

(86) PCT No.: PCT/CN2019/090807
§ 371 (c)(1),
(2) Date: Nov. 12, 2019

(87) PCT Pub. No.: WO2020/237725
PCT Pub. Date: Dec. 3, 2020

(65) Prior Publication Data
US 2020/0381482 A1 Dec. 3, 2020

(51) Int. Cl.
*H01L 27/32* (2006.01)

(52) U.S. Cl.
CPC ........ *H01L 27/322* (2013.01); *H01L 27/3211* (2013.01); *H01L 2251/5369* (2013.01)

(58) Field of Classification Search
CPC .......................... H01L 27/322; H01L 27/3211
See application file for complete search history.

(56) References Cited

U.S. PATENT DOCUMENTS 8,866,992 B2\* 10/2014 Kim ...................... G02B 6/0026
349/61
2020/0251530 A1\* 8/2020 Lee ...................... H01L 27/3213

\* cited by examiner

*Primary Examiner* — Jose R Diaz

(57) ABSTRACT

The present invention provides a display panel and a manufacturing method thereof. The display panel comprises a blue organic light-emitting diode (OLED) layer, a thin film encapsulation layer, and a quantum dot color film layer, wherein a serrated encapsulation layer disposed on a side surface of the quantum dot color film layer near the thin film encapsulation layer. The method for manufacturing the display panel comprises a quantum dot color film layer manufacturing step, a serrated encapsulation layer manufacturing step, a blue OLED layer manufacturing step, and a thin film encapsulation layer manufacturing step. The technical effect of the present invention is that the serrated encapsulation layer is disposed on a surface of the quantum dot color film layer, so that blue light is refracted, optical path of blue light in the quantum dot layer is increased, and light conversion efficiency of blue light is improved.

6 Claims, 3 Drawing Sheets

DISPLAY PANEL AND MANUFACTURING METHOD THEREOF

BACKGROUND OF INVENTION

Field of Invention

The present invention relates to the display field, and particularly, to a display panel and a method for manufacturing the display panel.

Description of Prior Art

Quantum dot (QD) materials have many advantages, such as high luminous purity, adjustable wavelengths, and stable materials. Using these advantages of quantum dots can greatly improve colour gamut of a flat panel display. Presently, application of quantum dot in flat panel display is mainly focused on making red and green quantum dots into engineering plastic films or glass tubes and using them in thin film transistor-liquid crystal display (TFT-LCD) backlight. Because this technology is based on TFT-LCD technology, application of quantum dots in thin field is limited.

Quantum dot organic light-emitting diode (QD-OLED) structure display uses blue organic light-emitting diode (OLED) as underlying backlight, and then matches upper layer with red and green quantum dots and corresponding color filters. It can not only obtain the advantages of OLED display's self-luminescence and thinning, but also improve display effect by combining high gamut characteristics of quantum dot materials. The structure utilizes photoluminescence characteristics of quantum dots, excites red-green quantum dots to emit monochrome red-green light through the blue OLED of the backlight source, and then matches blue light emitted by the blue OLED itself to display the full-color picture of the high color gamut.

Color film of quantum dots in QD-OLED structure display can be produced by inkjet printing (IJP). The technical advantage of IJP is that it can control position and volume of dripping ink, so that it can print film at the pixel level. Therefore, this technology is suitable for large-scale and high-precision display manufacturing. In addition, using IJP technology to fabricate quantum dot color film can greatly reduce the cost of panel production. Because the QD layer of IJP film is directly related to optical conversion efficiency of devices, optimizing the structure and material of QD layer is a very important method for improving optical conversion efficiency.

As shown in FIG. 1, which is a cross-sectional diagram of prior art QD-OLED, the main body of QD-OLED can be roughly divided into four parts: a blue OLED 100, a thin film encapsulation layer 200, a color film layer (CF), and a quantum dot layer (OD layer). The CF and QD layer are collectively referred to as a quantum dot color layer 300 (QDCF).

SUMMARY OF INVENTION

An object of the present invention is to solve a technical problem of a low blue light conversion efficiency in the existing quantum dot OLED.

For the above-mentioned objective, the present invention provides a display panel, wherein includes a blue organic light-emitting diode (OLED) layer; a thin film encapsulation layer disposed on a side surface of the blue OLED layer; a quantum dot color film layer disposed on a side surface of the thin film encapsulation layer away from the blue OLED layer; and a serrated encapsulation layer disposed on a side surface of the quantum dot color film layer near the thin film encapsulation layer; wherein the serrated encapsulation layer comprises: a planar encapsulation layer; and a plurality of sawteeth protruded from a side surface of the planar encapsulation layer toward the blue OLED layer.

Further, the quantum dot color film layer comprises: a quantum dot layer disposed on the side surface of the thin film encapsulation layer away from the blue OLED layer; and a color film layer disposed on a side surface of the quantum dot layer away from the thin film encapsulation layer.

Further, the quantum dot color film layer comprises: a quantum dot layer disposed on the surface of the side of the thin film encapsulation layer away from the blue OLED layer; and a color film layer disposed on the surface of a side of the quantum dot layer away from the thin film encapsulation layer.

Further, the quantum dot layer comprises a red quantum dot region, a green quantum dot region, and a transparent region.

Further, the serrated encapsulation layer comprises: a sawtooth region oppositely disposed from the red quantum dot region and the green quantum dot region; and a planar region oppositely disposed from the transparent region.

Further, the color film layer comprises: a red filter oppositely disposed from the red quantum dot region; a green filter oppositely disposed from the green quantum dot region; and a blue filter oppositely disposed from the transparent region.

Further, a material of the serrated encapsulation layer is a transparent photoresist material or a transparent polyimide.

For the above-mentioned objective, the present invention also provides a method for manufacturing a display panel comprising: a quantum dot color film layer manufacturing step of forming a quantum dot color film layer; a serrated encapsulation layer manufacturing step of forming a serrated encapsulation layer on a surface of the quantum dot color film layer; a blue organic light-emitting diode (OLED) layer manufacturing step of forming a blue OLED layer to make the blue OLED layer oppositely disposed from the quantum dot color film layer; and a thin film encapsulation layer manufacturing step of forming a thin film encapsulation layer on a side surface of the blue OLED layer facing the quantum dot color film layer; wherein during the serrated encapsulation layer manufacturing step, the serrated encapsulation layer comprises a planar encapsulation layer and a sawtooth, and the sawtooth protrudes from the planar encapsulation layer and faces a side surface of the blue OLED layer.

Further, the serrated encapsulation layer manufacturing step comprises: a transparent film layer manufacturing step of forming a transparent film layer on a side surface of the quantum dot color film layer; a template layer manufacturing step of pressing a template layer on an upper surface of the transparent film layer; a photocuring step of employing a photocuring process on the transparent film layer; and a template layer removing step of removing the template.

Further, the quantum dot color film layer manufacturing step comprises: a color film layer forming step of forming a color film layer on a substrate, wherein the color film layer comprises a red color filter, a green color filter, and a blue color filter formed therein; and a quantum dot layer forming step of forming a quantum dot layer on the color film layer, wherein the quantum dot layer comprises a red quantum dot region, a green quantum dot region, and a transparent region defined therein; wherein the red quantum dot region is oppositely disposed from the red filter, the green quantum dot region is oppositely disposed from the green filter, and the transparent region is oppositely disposed from the blue filter.

Further, during the template manufacturing step, a sawtooth pattern and a planar pattern are defined on a lower surface of the template;

Wherein the sawtooth pattern is oppositely disposed from the red quantum dot region and the green quantum dot region, and the planar pattern is oppositely disposed from the transparent region.

The technology of the present invention consists in laminating the transparent film under the quantum dot color film layer to print the serrated encapsulation layer, the serrated encapsulation layer comprises the sawtooth region and the planar region, the sawtooth region oppositely disposed from the red quantum dot region and the green quantum dot region, the planar region oppositely disposed from the transparent region such that a incident light is refracted in the sawtooth region, and an optical path is increased when passing through the red quantum dot region and the green quantum dot region, thereby improving conversion efficiency of blue light, and at the same time, the serrated encapsulation layer can still be block water oxygen and protect quantum dot color film layer.

Figure 1:
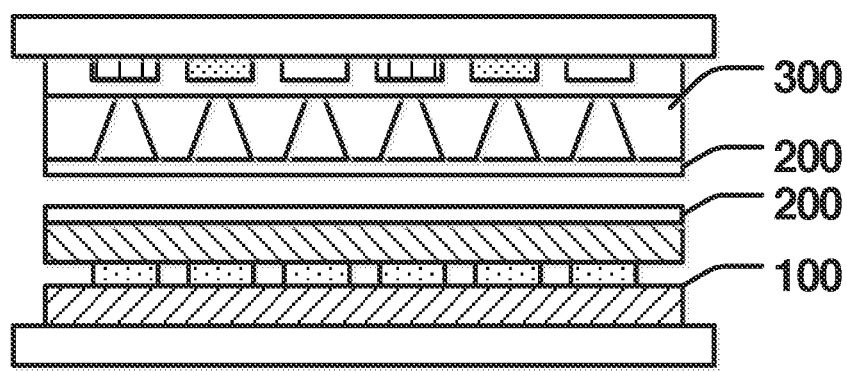
FIG. 1 is a structural schematic view of a display panel of the prior art.

a blue OLED 100; a thin film encapsulation layer 200; a quantum dot color film layer 300;

a substrate 1;

a blue OLED layer 2; a blue light source 21;

a thin film encapsulation layer 3;

a serrated encapsulation layer 4;

a quantum dot color film layer 5; a quantum dot layer 51; a color film layer 52;

a red quantum dot region 511; a green quantum dot region 512; a transparent region 513;

a red filter 521; a green filter 522; and a blue filter 523.

DETAILED DESCRIPTION OF PREFERRED EMBODIMENTS

The preferred embodiments of the present invention are described in detail below with reference to the accompanying drawings, in order to allow those skilled in the art to more readily understand how to implement the invention. However, the present invention may be embodied in many different forms of embodiments, and the scope of the present invention is not limited to the embodiments described herein. The description of the embodiments below is not intended to limit the scope of the present invention.

The directional terms mentioned in the present invention, such as "upper", "lower", "before", "after", "left", "right", "inside", "outside", "side", etc., are only attached directions in the figures, the directional terms adopted herein are used to explain and describe the present invention, and are not intended to limit the scope of the present invention.

In the drawings, structurally identical components are denoted by the same reference numerals, and structurally or functionally similar components are denoted by like reference numerals. Moreover, dimensions and thicknesses of each component shown in the drawings are arbitrarily shown for ease of understanding and description, and the invention does not limit the size and thickness of each component.

When a component is described as "on" another component, the component can be placed directly on the other component. There can also be an intermediate component on which the component is placed, and the intermediate component is placed on another component. When a component is described as "installed to" or "connected to" another component, it can be understood as "directly" or "connected", or a component is "mounted to" or "connected" through an intermediate component to another component.

Figure 2:
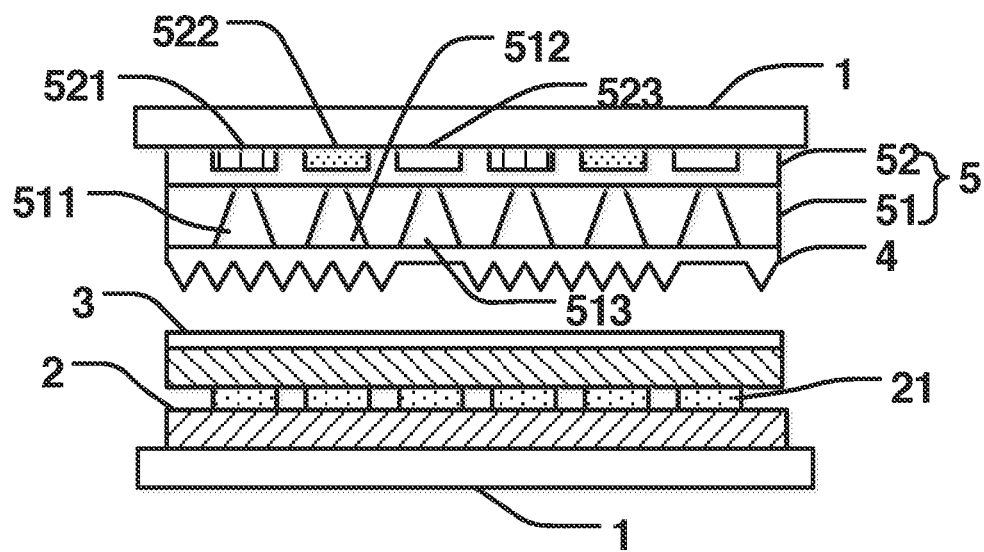
FIG. 2 is a structural schematic view of a display panel according to an embodiment of the present invention.

As shown in FIG. 2, the present embodiment provides a display panel comprising: a substrate 1, a blue organic light-emitting diode (OLED) layer 2, a thin film encapsulation layer 3, a serrated encapsulation layer 4, and a quantum dot color film layer 5.

The blue OLED layer 2 is disposed on an upper surface of the substrate 1. The blue OLED layer 2 comprises a blue light source 21. The blue light source 21 emits blue light.

The thin film encapsulation layer 3 is disposed on an upper surface of the blue OLED layer 2 for blocking water oxygen and protecting the blue OLED layer 2.

The quantum dot color film layer 5 is disposed above the thin film encapsulation layer 3 and oppositely disposed from the blue OLED layer 2. A lower surface of the quantum dot color film layer 5 is provided with the serrated encapsulation layer 4. The serrated encapsulation layer 4 comprises a planar encapsulation layer and a plurality of sawteeth. The plurality of sawteeth protrude from the planar encapsulation layer and face the thin film encapsulation layer 3. The serrated encapsulation layer 4 comprises a sawtooth region and a planar region. A material of the serrated encapsulation layer 4 comprises a transparent photoresist material or a transparent polyimide (PI). The serrated encapsulation layer 4 can still block external water and oxygen, and protect the quantum dot color film layer 5. Quantum dot material of the quantum dot colour film layer 5 is anisotropic, which can enhance perspective of the blue OLED layer 2. The quantum dot color film layer 5 comprises a quantum dot layer 51 and a color film layer 52.

The quantum dot layer 51 is disposed on an upper surface of the serrated encapsulation layer 4. The quantum dot layer 51 comprises a red quantum dot region 511, a green quantum dot region 512, and a transparent region 513. The red quantum dot region 511 and the green quantum dot region 512 are oppositely disposed from the sawtooth region, the transparent region 513 oppositely disposed from the planar region, and the red quantum dot region 511, the green quantum dot region 512, and the transparent region 513 oppositely disposed from the blue light source 21, in order to ensure that blue light emitted by the blue light source 21 passes through the red quantum dot region 511, the green quantum dot region 512, and the transparent region 513.

The color film layer 52 is disposed on an upper surface of the quantum dot layer 51. The color film layer 52 comprises a red filter 521, a green filter 522, and a blue filter 523. The red filter 521 oppositely disposed from the red quantum dot region 511, the green filter 522 is oppositely disposed from the green quantum dot region 512, and the blue filter 523 is oppositely disposed from the transparent region 513, in order to ensure that blue light emitted by the blue light source 21 passes through the quantum dot layer 51 and then emits red, green, and blue light from the color film layer 52.

Figure 3:
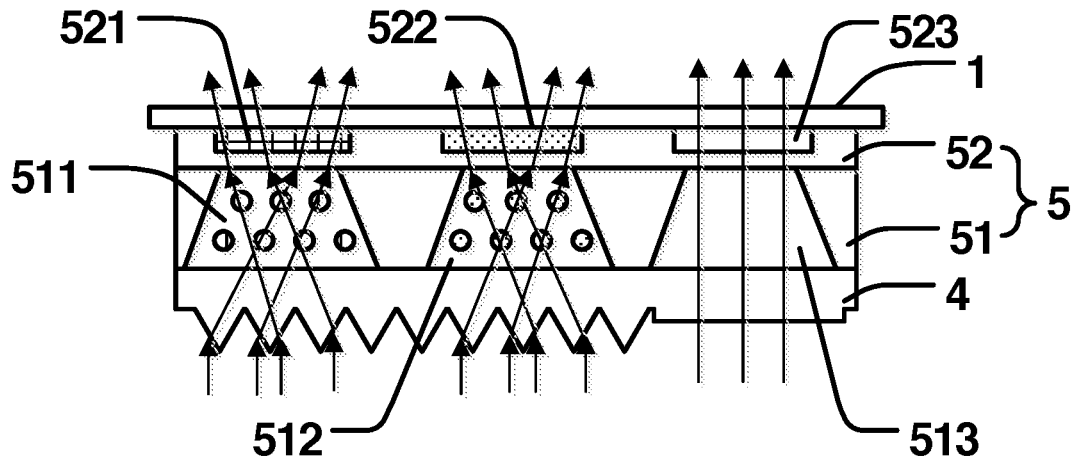
FIG. 3 is a schematic view of light rays of blue light in quantum dot color film layer according to an embodiment of the present invention.

As shown in FIG. 3, blue light is emitted from the blue OLED layer, because the transparent region 513 of the quantum dot layer 5 has no obstruction to light, and the serrated encapsulation layer 4 below the transparent region 513 is a planar region, which does not produce any effect on the incident light. Hence, light can be directly emitted, and after passing through the blue filter 523, it emits blue light. The other part is incident from the sawtooth region below the red quantum dot region 511 and the green quantum dot region 512. Because the sawtooth is triangular in shape, it refracts light to some extent, so this part of light refracts through the sawtooth region. Compared with the light emitted from the transparent region 513, the light path of the light emitted from the quantum dot layer 51 is obviously increased. This can improve the conversion efficiency of blue light.

The technical effect of the display panel described in the present embodiment is that the thin film encapsulation layer under the quantum dot color film layer is replaced by the serrated encapsulation layer. The serrated encapsulation layer comprises the sawtooth region and a planar region. The sawtooth region oppositely disposed from the red quantum dot region and the green quantum dot region of the quantum dot layer, and the planar region oppositely disposed from the transparent region, such that incident light is refracted in the sawtooth region, and an optical path is increased when passing through the red quantum dot region and the green quantum dot region, thereby improving conversion efficiency of blue light. In the meantime, the serrated encapsulation layer can still block water oxygen and protect the quantum dot color film layer.

Figure 4:
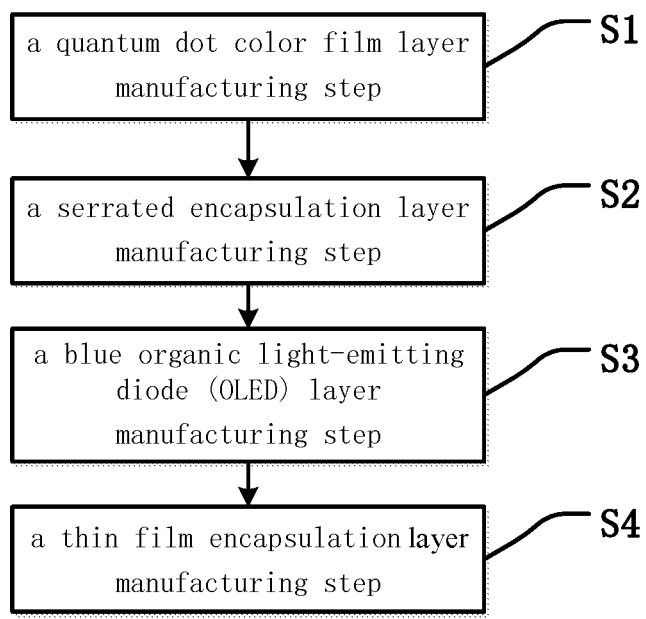
FIG. 4 is a flow chart of a method for preparing a display panel according to an embodiment of the present invention.

As shown in FIG. 4, the present invention also provides a preparation method of the display panel, comprising steps S1 to S4.

Figure 5:
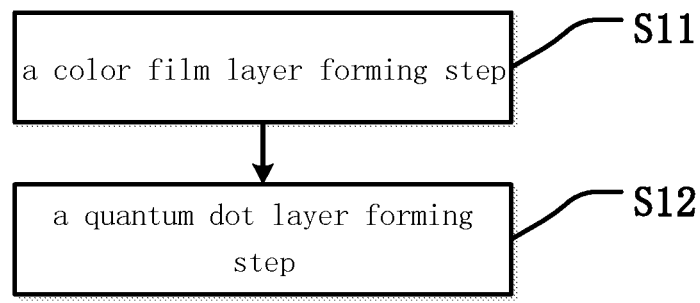
FIG. 5 is a flow chart of a step for setting a quantum dot color film layer according to an embodiment of the present invention.

Step S1 is a quantum dot color film layer manufacturing step of forming the quantum dot color film layer on a substrate. The quantum dot color film layer manufacturing step comprises steps S11 to S12 (refer to FIG. 5).

Step S11 is a color film layer manufacturing step of forming the color film layer on a substrate, wherein the color film layer comprises a red color filter, a green color filter, and a blue color filter formed therein. Step S12 is a quantum dot layer manufacturing step of forming the quantum dot layer on the color film layer, wherein the quantum dot layer comprises a red quantum dot region, a green quantum dot region, and a transparent region defined therein; wherein the red quantum dot region is oppositely disposed from the red filter, the green quantum dot region is oppositely disposed from the green filter, and the transparent region is oppositely disposed from the blue filter, in order to ensure that incident blue light can be emitted as red light after passing through the red quantum dot region, emitted as green light after passing through the green quantum dot region, and emitted as blue light after passing through the transparent area.

Figure 6:
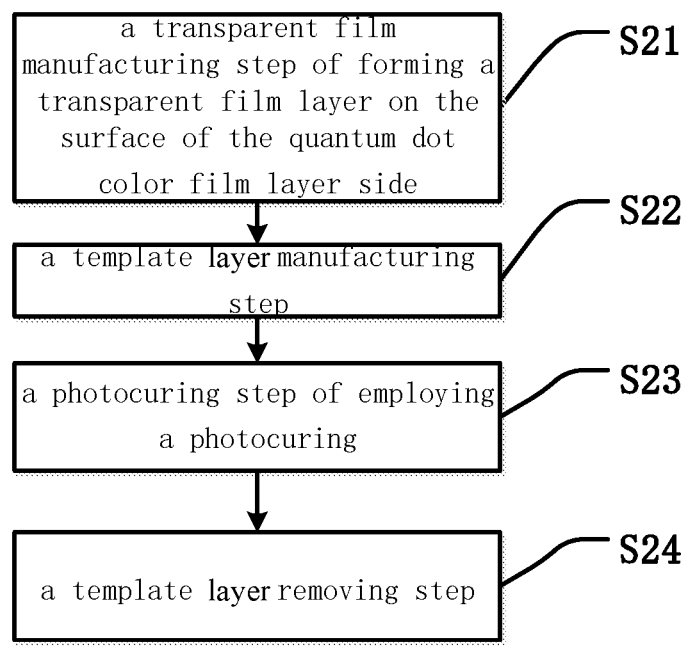
FIG. 6 is a flow chart of a step for preparing a serrated encapsulation layer according to an embodiment of the present invention.

Step S2 is a serrated encapsulation layer manufacturing step of forming the serrated encapsulation layer on an upper surface of the quantum dot color film layer for refracting incident light and blocking external water oxygen. The serrated encapsulation layer manufacturing step comprises the following steps S21 to S24 (refer to FIG. 6).

Step S21 is a transparent film layer manufacturing step of coating a surface of one side of the quantum dot color film layer with a transparent photoresist material or a transparent polyimide material to form the transparent film layer. Step S22 is a template manufacturing step of pressing the template on an upper surface of the transparent film layer. A lower surface of the template is provided with a sawtooth pattern and a planar pattern, wherein the sawtooth pattern is disposed on the red quantum dot region and the green quantum dot region, and the planar pattern disposed on the transparent region. Step S23 is a photocuring step of employing an ultraviolet light photocuring process to the transparent film layer. Step S24 is a template removing step of removing the template to form the serrated encapsulation layer.

The serrated encapsulation layer comprises a sawtooth region and a planar region, so that incident light is refracted when it is incident on the sawtooth layer, and light path of refracted light in the red quantum dot region and the green quantum dot region is increased to improve the conversion efficiency of blue light. When incident light enters the planar region, it is unaffected and emits blue light directly. At the same time, the serrated encapsulation layer can still block water and oxygen and protect the quantum dot color film layer.

Step S3 is a blue organic light-emitting diode (OLED) layer manufacturing step of forming the blue OLED layer to make the blue OLED layer oppositely disposed from the quantum dot color film layer. The blue OLED layer is provided with a blue light source, and the blue light source is oppositely disposed from the red quantum dot region, the green quantum dot region and the transparent region to ensure that light emitted by the blue light source can be incident on the red quantum dot region, the green quantum dot region, and the transparent area, thereby increasing light output rate.

Step S4 is a thin film encapsulation layer manufacturing step of forming the thin film encapsulation layer on a side surface of the blue OLED layer facing the quantum dot color film layer. The thin film encapsulation layer is used to block external water and oxygen and protect the blue OLED layer.

The technical effect of the preparation method of the display panel described in the present embodiment consists of laminating the transparent film layer under the quantum dot color film layer to print the serrated encapsulation layer. The serrated encapsulation layer comprises the sawtooth region and the planar region. The sawtooth region oppositely disposed from the red quantum dot region and the green quantum dot region, and the planar region oppositely disposed from the transparent region such that incident light is refracted in the sawtooth region, and optical path is increased when passing through the red quantum dot region and the green quantum dot region, thereby improving conversion efficiency of blue light. At the same time, the serrated encapsulation layer can still block water oxygen and protect quantum dot color film layer.

All of the above are only the preferred embodiment of the present invention. It should be pointed out that those with ordinary skills in this technical field can make a number of improvements and modifications without departing from the principles of the present invention, and these improvements and modifications should also be considered as being under the scope of protection of the present invention.

What is claimed is:

1. A display panel, comprising:
    a blue organic light-emitting diode (OLED) layer;
    a thin film encapsulation layer disposed on a side surface of the blue OLED layer;
    a quantum dot color film layer disposed on a side surface of the thin film encapsulation layer away from the blue OLED layer; and
    a serrated encapsulation layer disposed on a side surface of the quantum dot color film layer near the thin film encapsulation layer;
    wherein the serrated encapsulation layer comprises:
    a planar encapsulation layer; and
    a plurality of sawteeth protruded from a side surface of the planar encapsulation layer toward the blue OLED layer;
    wherein the quantum dot color film layer comprises:
        a quantum dot layer disposed on the side surface of the thin film encapsulation layer away from the blue OLED layer; and
        a color film layer disposed on a side surface of the quantum dot layer away from the thin film encapsulation layer;
    wherein the quantum dot layer comprises a red quantum dot region, a green quantum dot region, and a transparent region; and
    wherein the serrated encapsulation layer comprises:
        a sawtooth region oppositely disposed from the red quantum dot region and the green quantum dot region; and
        a planar region oppositely disposed from the transparent region.

2. The display panel of claim 1, wherein the color film layer comprises:
    a red filter oppositely disposed from the red quantum dot region;
    a green filter oppositely disposed from the green quantum dot region; and
    a blue filter oppositely disposed from the transparent region.

3. The display panel of claim 1, wherein a material of the serrated encapsulation layer is a transparent photoresist material or a transparent polyimide.

4. A method for manufacturing a display panel, comprising:
    a quantum dot color film layer manufacturing step of forming a quantum dot color film layer;
    a serrated encapsulation layer manufacturing step of forming a serrated encapsulation layer on a surface of the quantum dot color film layer;
    a blue organic light-emitting diode (OLED) layer manufacturing step of forming a blue OLED layer to make the blue OLED layer oppositely disposed from the quantum dot color film layer; and
    a thin film encapsulation layer manufacturing step of forming a thin film encapsulation layer on a side surface of the blue OLED layer facing the quantum dot color film layer;
    wherein during the serrated encapsulation layer manufacturing step, the serrated encapsulation layer comprises a planar encapsulation layer and a sawtooth, and the sawtooth protrudes from the planar encapsulation layer and faces a side surface of the blue OLED layer; and
    wherein the serrated encapsulation layer manufacturing step comprises:
        a transparent film layer manufacturing step of forming a transparent film layer on a side surface of the quantum dot color film layer;
        a template manufacturing step of pressing a template layer on an upper surface of the transparent film layer;
        a photocurinq step of employing a photocuring process on the transparent film layer; and
        a template layer removing step of removing the template.

5. The method for manufacturing the display panel of claim 4, wherein the quantum dot color film layer manufacturing step comprises:
    a color film layer forming step of forming a color film layer on a substrate, wherein the color film layer comprises a red color filter, a green color filter, and a blue color filter formed therein; and
    a quantum dot layer forming step of forming a quantum dot layer on the color film layer, wherein the quantum dot layer comprises a red quantum dot region, a green quantum dot region, and a transparent region defined therein;
    wherein the red quantum dot region is oppositely disposed from the red filter, the green quantum dot region is oppositely disposed from the green filter, and the transparent region is oppositely disposed from the blue filter.

6. The method for manufacturing the display panel of claim 5, wherein during the template manufacturing step, a sawtooth pattern and a planar pattern are defined on a lower surface of the template;
    wherein the sawtooth pattern is oppositely disposed from the red quantum dot region and the green quantum dot region, and the planar pattern is oppositely disposed from the transparent region.

* * * * *

UNITED STATES PATENT AND TRADEMARK OFFICE
CERTIFICATE OF CORRECTION

PATENT NO. : 10,943,956 B2  
APPLICATION NO. : 16/612966  
DATED : March 9, 2021  
INVENTOR(S) : Wenxiang Peng Page 1 of 1

It is certified that error appears in the above-identified patent and that said Letters Patent is hereby corrected as shown below:

On the Title Page

Add item (30) as follows:  
--(30) Foreign Application Priority Data  
May 27, 2019 (CN) 201910444084.0--

Signed and Sealed this  
Thirty-first Day of August, 2021

Drew Hirshfeld  
*Performing the Functions and Duties of the*  
*Under Secretary of Commerce for Intellectual Property and*  
*Director of the United States Patent and Trademark Office*